United States Patent
Verilhac et al.

(10) Patent No.: US 10,559,771 B2
(45) Date of Patent: Feb. 11, 2020

(54) METHOD FOR PRODUCING A FIRST ELECTRODE/ACTIVE LAYER/SECOND ELECTRODE STACK

(71) Applicants: COMMISSARIAT A L'ENERGIE ATOMIQUE ET AUX ENERGIES ALTERNATIVES, Paris (FR); ISORG, Grenoble (FR); TRIXELL, Moirans (FR)

(72) Inventors: Jean-Marie Verilhac, Verilhac (FR); Simon Charlot, Grenoble (FR)

(73) Assignees: COMMISSARIAT A L'ENERGIE ATOMIQUE ET AUX ENERGIES ALTERNATIVES, Paris (FR); ISORG, Grenoble (FR); TRIXELL, Moirans (FR)

( * ) Notice: Subject to any disclaimer, the term of this patent is extended or adjusted under 35 U.S.C. 154(b) by 39 days.

(21) Appl. No.: 15/736,266

(22) PCT Filed: Jun. 16, 2016

(86) PCT No.: PCT/EP2016/063922
§ 371 (c)(1),
(2) Date: Dec. 13, 2017

(87) PCT Pub. No.: WO2016/202938
PCT Pub. Date: Dec. 22, 2016

(65) Prior Publication Data
US 2018/0159060 A1    Jun. 7, 2018

(30) Foreign Application Priority Data

Jun. 16, 2015   (FR) ..................... 15 55480

(51) Int. Cl.
*H01L 51/44*   (2006.01)
*H01L 51/50*   (2006.01)
(Continued)

(52) U.S. Cl.
CPC .... *H01L 51/442* (2013.01); *H01L 31/022425* (2013.01); *H01L 31/022466* (2013.01);
(Continued)

(58) Field of Classification Search
CPC . H01L 51/442; H01L 51/441; H01L 51/5012; H01L 51/5206; H01L 51/5234;
(Continued)

(56) References Cited

U.S. PATENT DOCUMENTS 4,729,970 A * 3/1988 Nath ................. H01L 21/28
136/258
5,437,999 A * 8/1995 Diebold ............. C12Q 1/001
204/403.11

(Continued)

FOREIGN PATENT DOCUMENTS

FR    2 991 505 A1    12/2013
JP    H11-54286 A    2/1999
(Continued)

OTHER PUBLICATIONS

G. Wantz et al., "Stabilizing polymer-based bulk heterojunction solar cells via crosslinking," Polymer Int, vol. 63, 2014, pp. 1346-1361.

*Primary Examiner* — Jayne L Mershon
(74) *Attorney, Agent, or Firm* — Baker & Hostetler LLP

(57) ABSTRACT

A process for producing a stack of a first electrode/active layer/second electrode, which stack is intended for an electronic device, in particular an organic photodetector or an organic solar cell, the process comprises the following steps: (a) depositing a first conductor layer on the front side of a substrate, in order to form the first electrode; and (b) depositing an active layer taking the form of a thin organic semiconductor layer, this layer including discontinuous zones; wherein this process further comprises the following steps: (d) depositing a resist layer on that side of the stack which is opposite the substrate, which is at least partially transparent; (e) exposing the resist layer via the back side of the substrate; (f) developing the resist layer; and (g) depositing a second conductor layer in order to form the conductive second electrode.

8 Claims, 7 Drawing Sheets

(51) Int. Cl.
  *H01L 31/0224*  (2006.01)
  *H01L 51/52*   (2006.01)
  *H01L 51/56*   (2006.01)

(52) U.S. Cl.
  CPC ...... *H01L 51/5012* (2013.01); *H01L 51/5206* (2013.01); *H01L 51/5234* (2013.01); *H01L 51/56* (2013.01); *H01L 2251/5392* (2013.01); *H01L 2251/568* (2013.01)

(58) Field of Classification Search
  CPC ............. H01L 51/56; H01L 31/022425; H01L 31/022466
  See application file for complete search history.

(56) References Cited

U.S. PATENT DOCUMENTS

| | | | | |
|---|---|---|---|---|
| 6,590,335 | B1* | 7/2003 | Nagayama | H01L 27/3281 313/504 |
| 9,018,632 | B2* | 4/2015 | Shiomi | H01L 27/124 257/209 |
| 2010/0183806 | A1* | 7/2010 | Benwadih | B05D 5/00 427/226 |
| 2011/0312120 | A1* | 12/2011 | Weiner | H01L 31/03923 438/64 |
| 2012/0126277 | A1* | 5/2012 | Tanaka | H01L 51/50 257/99 |
| 2013/0087200 | A1* | 4/2013 | Xue | H01L 31/02327 136/259 |
| 2014/0299184 | A1* | 10/2014 | Fonash | H01L 31/02366 136/256 |
| 2015/0144899 | A1* | 5/2015 | Verilhac | H01L 51/0023 257/40 |
| 2015/0221709 | A1 | 8/2015 | Shimamura et al. | |
| 2015/0249226 | A1* | 9/2015 | Michels | H01L 51/42 257/40 |
| 2016/0211245 | A1* | 7/2016 | Do | H01L 25/0753 |

FOREIGN PATENT DOCUMENTS

| | | |
|---|---|---|
| WO | 2007/004121 A2 | 1/2007 |
| WO | 2014/046539 A1 | 3/2014 |

* cited by examiner

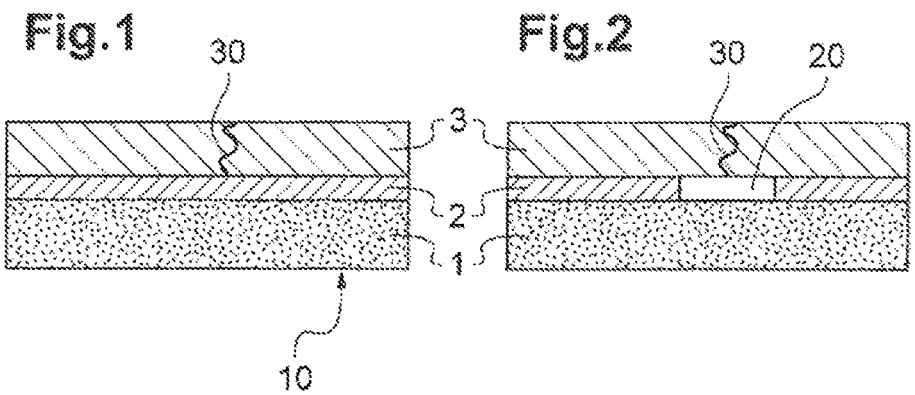
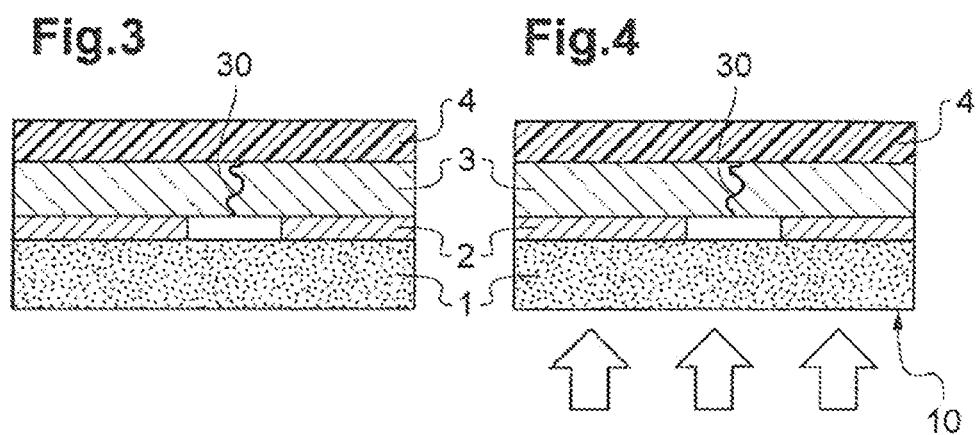
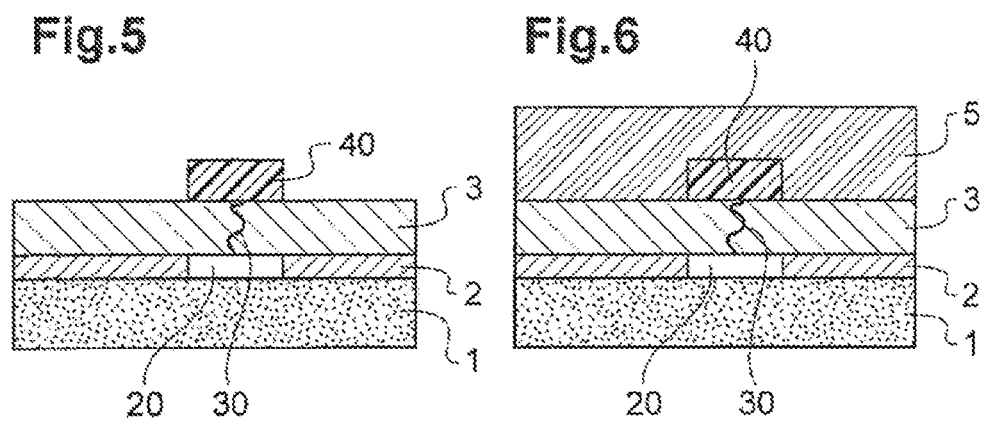

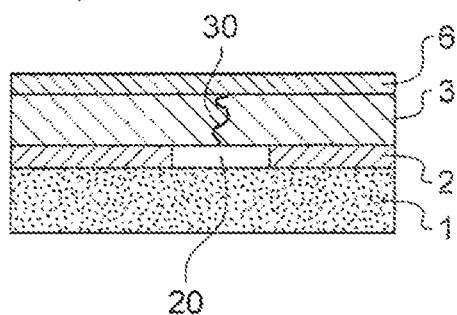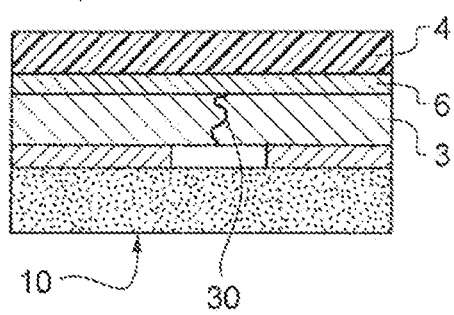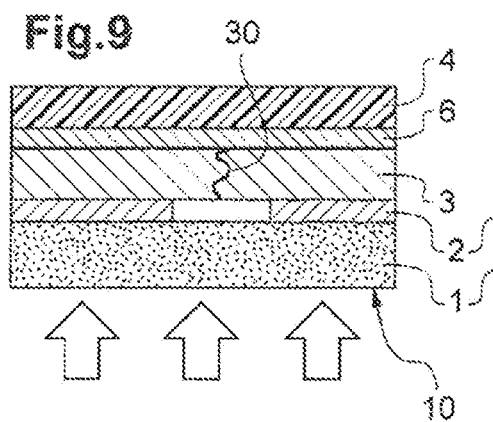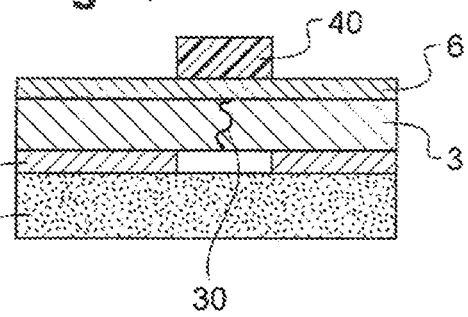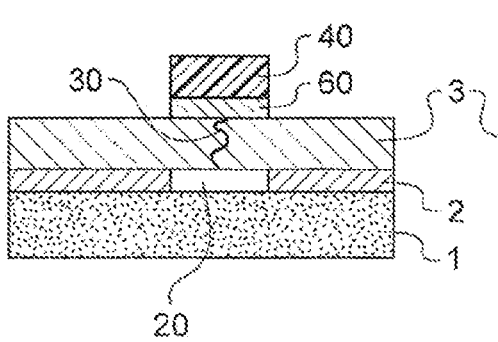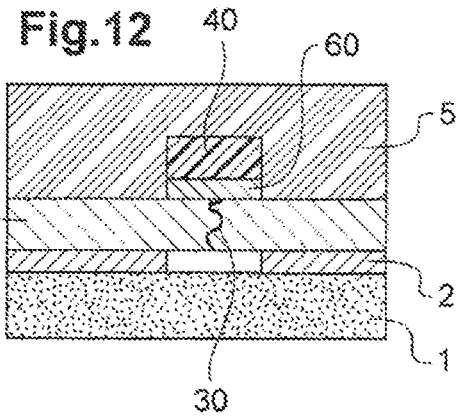

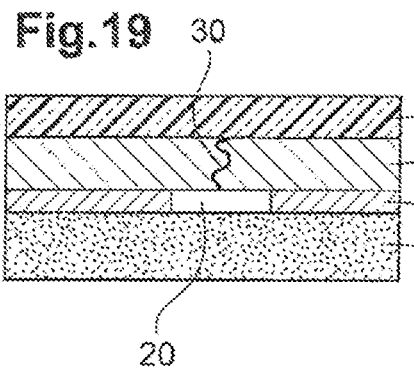
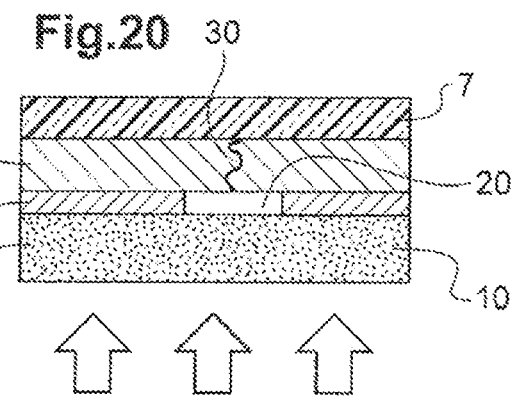
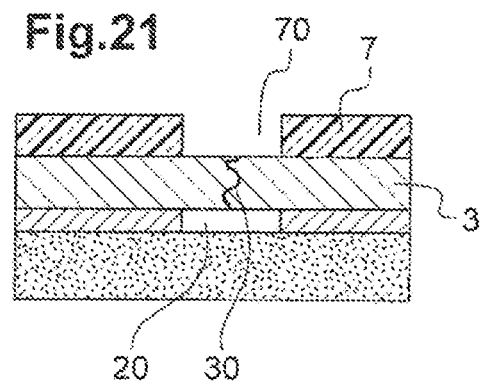
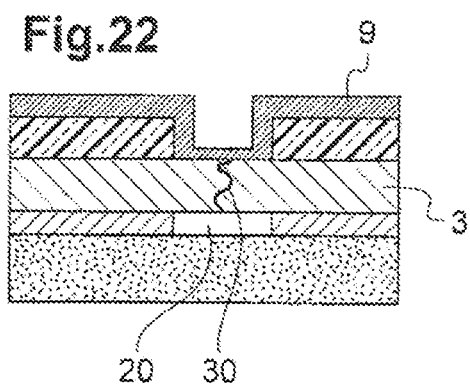
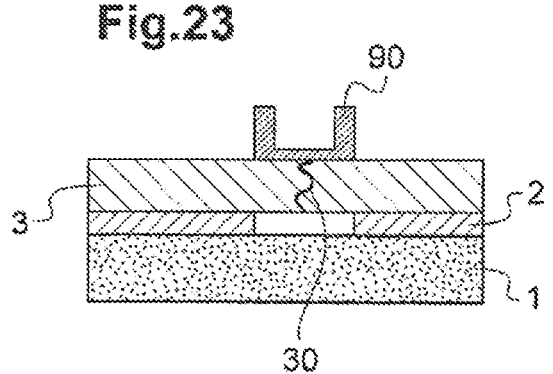
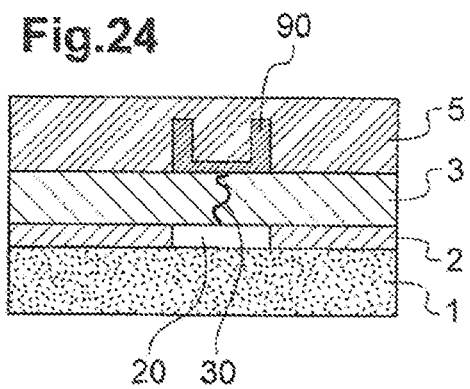

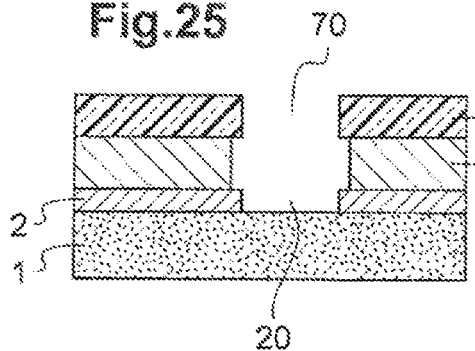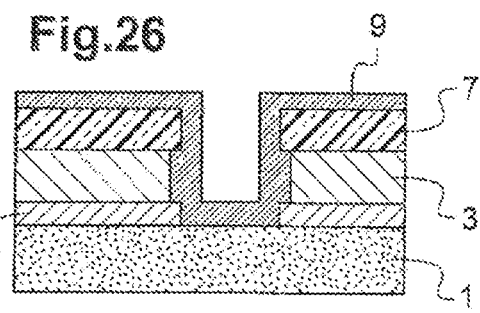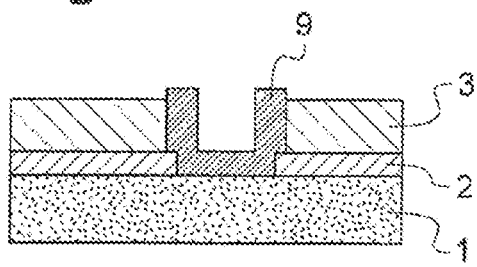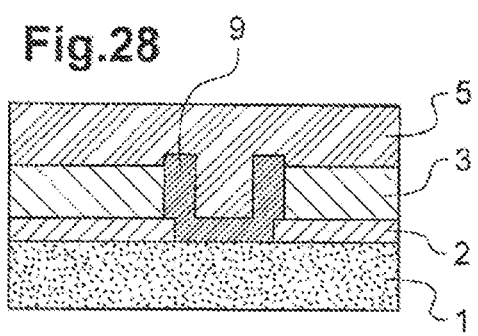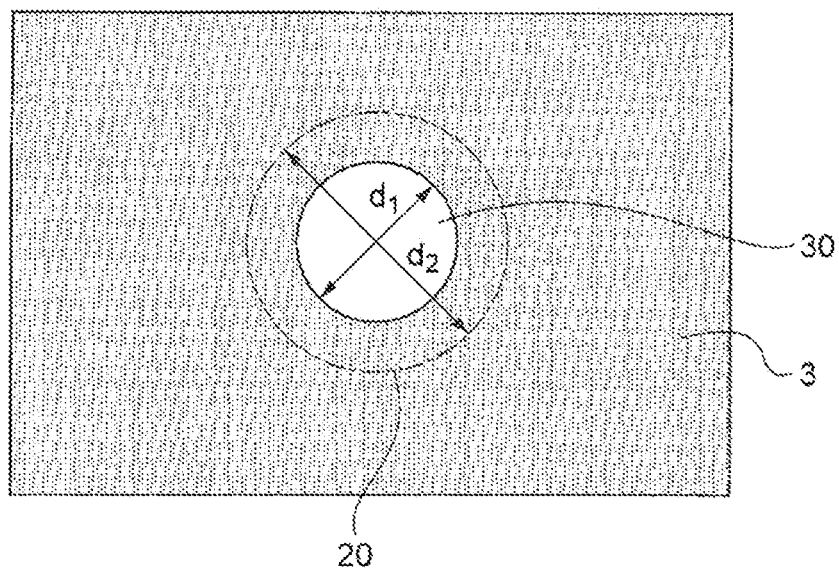

METHOD FOR PRODUCING A FIRST ELECTRODE/ACTIVE LAYER/SECOND ELECTRODE STACK

CROSS-REFERENCE TO RELATED APPLICATIONS

This application is a National Stage of International patent application PCT/EP2016/063922, filed on Jun. 16, 2016, which claims priority to foreign French patent application No. FR 1555480, filed on Jun. 16, 2015, the disclosures of which are incorporated by reference in their entirety.

FIELD OF THE INVENTION

The invention relates to conductor/thin-organic-layer/conductor stacks conventionally used in electronic devices.

These devices may for example be current-rectifying diodes, solar cells, photodetector cells, capacitors, laser diodes, sensor devices, memories, transistors, or even light-emitting diodes. They are in particular organic electronic devices on flexible plastic substrates.

The invention more particularly applies to the field of the diode stacks used in organic solar cells or organic photodetectors.

BACKGROUND

In known prior-art devices, electrical leakage currents may be observed to appear through the thin organic layer that is supposed to electrically insulate the two conductive electrodes, which layer is also called the active layer.

These leakage currents are dependent, on the one hand, on intrinsic properties of the active layer (in particular its conductivity, on the presence of electrical traps, on the position of the HOMO-LUMO energy levels with respect to the work functions of the electrodes, or on the morphology of the layer) and, on the other hand, on extrinsic parameters such as parasitic electrical leakage currents.

These parasitic currents are not controlled. They essentially originate from topological defects, i.e. holes or morphological defects, i.e. zones of larger free volume. They are generated during the formation of the active layer.

Thus, the presence of holes in the active layer may lead to the two conductive electrodes short-circuiting locally. Moreover, the zones of different morphology are more propitious to electrical breakdown.

These defects in the active layer may be due to the materials used to form the layer, which take the form of a solution possibly including aggregates, i.e. material poorly dissolved in the solution. They may also result from defects present in the substrate, such as topological defects or peaks in the surface or zones of different surface tensions.

These parasitic leakage currents are very disadvantageous when they occur in organic photodetectors or current-rectifying diodes.

Specifically, in this case, the reverse-leakage and dark current of the diode must be very small (of the order of one $nA/cm^2$). Thus, the slightest electrical leakage through defects in the active layer may lead to this current increasing by several orders of magnitude and the performance of the diode being drastically and irreversibly degraded.

These parasitic leakage currents are also disadvantageous for organic solar cells, but to a lesser extent.

For such a device, the lower the leakage current of the diode, the more the solar cell will be able to respond to a weak illumination.

Thus, solutions for minimizing parasitic leakage currents in the active layer of a stack have already been proposed.

It has in particular been proposed to increase the thickness of the active layer, to filter the solutions before their deposition to form the active layer and to use substrates containing few defects.

However, the proposed solutions have drawbacks.

Specifically, too great an increase in the thickness of the active layer tends, for example, to degrade device performance. This is why the thickness of the active layer is generally about 200-300 nm. Moreover, a filtration requires a solution having a good solubility, this not being the case for all the materials currently available for active layers. In addition, the filtering step is difficult to implement on an industrial scale. Lastly, substrates having few defects are substrates with planarizing layers, which are of a high cost.

Mention may also be made of document FR-2991505, which describes a process for producing a stack of a first electrode/active layer/second electrode allowing parasitic electrical leakage currents to be decreased.

This process firstly consists in depositing a first conductor layer on a substrate, in order to form the first electrode, then an active layer, taking the form of a thin organic semiconductor layer, this layer containing defects.

This process then consists in removing locally, via chemical attack, the conductive first layer, through the defects in the active layer.

A second conductor layer is then deposited on the active layer, to form the conductive second electrode.

Because of the local removal of the conductive layer, level with the defects in the active layer, the two electrodes can no longer make contact and, thus, cannot create an electrical short-circuit through the active layer. Electrical leakage currents are therefore considerably decreased.

This process therefore allows the risks of short-circuits to be decreased.

However, it is not suitable in the case where the conductive second layer is very liquid. Specifically, it is then liable to infiltrate under the organic layer and to once again make contact with the conductive first layer beyond the etched zone under the defect.

In addition, the process requires the conductive first layer to be completely etched away level with the defects in order to prevent a short-circuit. Thus, in order to be effective, the process requires the conductive first layer to be substantially overetched with respect to the dimension of the aperture in the active layer, because, when the conductive second layer is deposited, it infiltrates a little under the active layer and may thus generate a short-circuit.

SUMMARY OF THE INVENTION

Thus, the purpose of the invention is to further decrease parasitic electrical leakage currents through the active layer of a stack of a conductor/active layer/conductor, while maintaining the performance of the corresponding devices.

The subject of the invention is a process for producing a stack of a first electrode/active layer/second electrode, which stack is intended for an electronic device, in particular an organic photodetector or an organic solar cell, said process including the following steps:

(a) depositing a first conductor layer on the front side of a substrate, in order to form the first electrode; and (b) depositing an active layer taking the form of a thin organic semiconductor layer, this layer including discontinuous zones.

According to the invention, this process also includes the following steps:

(d) depositing a resist layer on that side of the stack which is opposite the substrate, which substrate is at least partially transparent;

(e) exposing the resist layer via the back side of said substrate;

(f) developing the resist layer; and (g) depositing a second conductor layer in order to form the conductive second electrode.

In a first embodiment of the process, the resist is negative and step (f) leads to the formation of resist pads in the discontinuous zones.

As a variant, a buffer layer is deposited between steps (b) and (d).

In a second embodiment of the process, the resist is positive, step (f) leading to the formation of holes in the resist layer level with the discontinuous zones, and step (g) being carried out between steps (b) and (d), a step (h) of etching the conductive second electrode being carried out after step (f).

As a first variant, the process includes an additional step (i) consisting in removing the resist after the etching step (h).

As another variant, the process includes an additional step consisting in depositing a passivating layer on the conductive second electrode, before step (d) of depositing the resist layer.

In a third embodiment of the process according to the invention, the resist is positive, step (f) leading to the formation of holes in the resist level with the discontinuous zones, and the process includes two additional steps between steps (f) and (g), a step (j) of depositing a passivating layer on the resist layer and a step (k) of removing the resist.

As a first variant, before step (j), a step (l) of etching the active layer through the holes formed in the resist is provided.

As another variant, a buffer layer is deposited on the active layer between steps (b) and (d), a step of etching the buffer layer then being provided between steps (k) and (g).

In one particular embodiment of the process according to the invention, step (c) of removing the conductive first layer locally via chemical attack, through the discontinuous zones of the active layer, is provided after step (b).

BRIEF DESCRIPTION OF THE DRAWINGS

The invention will be better understood and other aims, advantages and features thereof will become more clearly apparent on reading the following description that is given with reference to the appended drawings, in which:

FIGS. 1 and 2 are cross-sectional views, showing steps (a) to (c) of the process according to the invention;

FIGS. 3 to 6 are cross-sectional views, showing steps (d) to (g) of the first embodiment;

FIGS. 7 to 12 are cross-sectional views, showing the steps of a first variant of the first embodiment of the process illustrated in FIGS. 3 to 6;

FIGS. 19 to 24 are cross-sectional views, showing steps (d) to (k) of the third embodiment of the invention;

FIGS. 25 to 28 are cross-sectional views, showing the steps of one variant of the third embodiment of the process according to the invention;

FIG. 29 is a view from above of a detail of FIG. 2;

DETAILED DESCRIPTION

Figure 13:
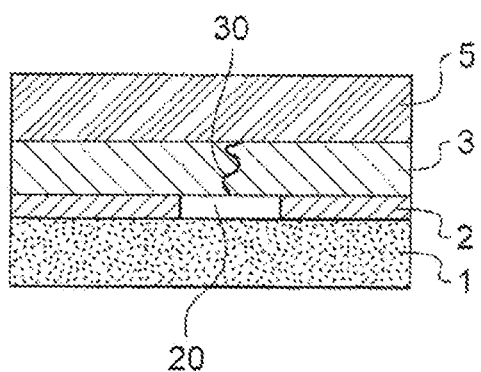
FIGS. 13 to 18 are cross-sectional views and show steps (d) to (h) of the second embodiment according to the invention.

Elements that are common to the various figures are referenced with the same references.

Steps (a) to (c) of the process according to the invention will be described with reference to FIGS. 1 to 3. They are common to all the embodiments of the process according to the invention.

FIG. 1 illustrates a substrate 1, which may be rigid or flexible.

It must have a transmittance of at least 20% at the wavelength of exposure of the resist that will be used subsequently in the process. Generally, the process may use any type of substrate that is not entirely opaque at the wavelength of this resist.

Preferably, this transmittance is at least 40%, or even at least 70%, at this wavelength.

It is for example a rigid substrate made of glass or of the fiber-optic-plate (FOP) type, or a flexible substrate made of plastic, for example of PET.

On the substrate 1, a layer 2 of a conductor has been deposited, in a step (a). This layer 2 will form the conductive first electrode.

This electrode must be opaque at the wavelength of the resist used subsequently in the process.

Generally, it is opaque in the exposure range of the resists used. The corresponding wavelengths are located in the UV (UVA, UVB and/or UVC) range(s). It will be noted that the wavelength of 365 nm corresponds to the exposure wavelength used for the resists most commonly used in photolithography.

The expression "opaque electrode" is understood here to mean an electrode that has a transmittance lower than 20% at the wavelength used to expose the resist. This transmittance is, preferably, lower than 10%, or even than 5% at this wavelength.

The thickness of this layer 2 is comprised between 1 nm and a plurality of microns. Preferably, it will be strictly larger than 5 nm and smaller than 500 nm.

This layer 2 may consist of a single layer or of a multilayer with specific interface layers.

The material of the layer 2 may be a metal, for example Au, Pd, Pt, Cr, Ti, Al or TiW.

The metal layer may be a bulk layer.

In this case, the thickness of the layer is preferably strictly larger than 5 nm.

The material of the layer 2 may also be a conductive oxide with a degraded transmittance in the UVA, or with a low natural transmittance in the UVB or UVC: for example ITO, AZO, Nb-doped $TiO_2$, FTO, GZO or IZO.

A plurality of types of multilayers may be envisioned.

It may firstly be a question of a stack of semiconductor or conductive oxides: for example ITO/TiOx, AZO/TiOx, ITO/$MoO_3$, ITO/$V_2O_5$, AZO/ZnO or FTO/NiO.

It is also possible to envision a stack of at least two layers made of a metal and a metal oxide. The following combinations may for example be envisioned: Cr/ZnO, Au/TiO$_2$, Au, MoO$_3$ or Cr/WO$_3$.

In particular, it may be a question of a stack of three layers, for example of the type: ITO/Ag/ITO, AZO/Ag/AZO or ZnO/Ag/ZnO.

In this case, the thicknesses of the stack are adjusted so as to modulate the optical spectrum of the stack and, in particular, in order to cut off the wavelength intended to be used for the exposure of the resist. For example, optical simulations in Optilayer show that a tri-layer stack of AZO/Ag/AZO with thicknesses of 300 nm/10 nm/300 nm would have a transmittance of 17% at 365 nm, whereas a stack with thicknesses of 600 nm/10 nm/600 nm would have a transmittance of 4% at 365 nm. It is therefore possible to modulate the thickness in order to make it so that the tri-layer cuts off the right wavelength. It is also envisionable to use more than three layers to form a Bragg mirror that cuts off at the desired wavelength.

The layer 2 also consists of a stack of a metal layer and of a layer made of an organic material in order to modulate its work function. It will be recalled here that the work function of a metal is the energy required to extract electrons from the layer or even to make them pass from their bound state in the metal to a non-bound state that corresponds to the vacuum level.

The organic material may be PEI, PEIE, a conjugated polyelectrolyte (poly[9,9-bis(3'-(N,N-dimethylamino)propyl)-2,7-fluorene-alt-2,7-(9,9-dioctylfluorene)] (PFN)) or non-conjugated polyelectrolyte (Nafion) or a SAM (self-assembled monolayer).

The layer 2 may be deposited using conventional vacuum techniques, for example by evaporation or cathode sputtering. It may also be deposited by wet processing, for example using a printing technique such as screen printing, in atomic form or in the form of a dispersion of particles. Other wet deposition techniques are for example spin coating, slot-die coating, rotogravure printing, flexographic printing, inkjet printing, doctoring, blade coating or even dip coating.

Generally, this first electrode 1 will be able to play the role of anode or cathode.

In addition, it must be able to be etched by wet or vapor etching, through defects that pass through the active layer, without any impact or with only a small impact on the properties of this active layer. The layer 2 is generally a layer that is spatially localized.

FIG. 1 shows that an active layer 3 is deposited on the layer 2, in a step (b).

The thickness of this layer 3 is preferably comprised between 10 nm and a plurality of microns.

In the case of organic photodetectors and organic solar cells, the active layer consists of at least one material that is of semiconductor nature.

The active layer advantageously consists of a blend of an electron donor and an electron acceptor. The semiconductor donor may be a molecule, an oligomer, or a π-conjugated organic polymer, i.e. one with an alternation of single bonds and double bonds. The blend conventionally used is the pair regioregular poly(3-hexylthiophene) (π-P3HT) and [6,6]-phenyl C61 butyric acid methyl ester ([60]PCBM). Other wide-bandgap donor polymers (PFB, TFB, PTAA, PCDTBT, etc.) or narrow-bandgap donor polymers (PDPP3T, PCPDTBT, Si-PCPDTBT, PDDTT, etc.) will possibly advantageously be used. Likewise, for the acceptor, other materials may advantageously be used, such as derivatives of C60, C70 or C80 (PCBM, indene-C60, indene-C60 bisadduct), acene-diimide molecules, polymer molecules (F8BT, N2200) or any other inorganic compound.

Thus, the active layer may be a heterojunction of an electron donor and an electron acceptor taking the form of a layer or of a stack of a plurality of layers. It may also be a question of a nanoscale blend of two materials forming a bulk heterojunction, i.e. an intimate blend of two materials on the nanoscale.

The layer 3 may be deposited in a continuous or spatially localized layer.

The active layer may be deposited by evaporation or coevaporation (case of molecules of low molecular masses) or by wet processing (materials in the form of molecules, oligomers, and polymers). Non-exhaustively, the wet deposition technique may be spin coating, slot-die coating, rotogravure printing, flexographic printing, screen printing, inkjet printing, doctoring or even dip coating.

In certain cases, the active layer will possibly be cross-linked in order to make it insoluble in the solvents present in the various layers deposited and/or used in the various etching steps provided in the process.

A plurality of processes may be used to cross-link the active layer. These processes are well described in the following document: Guillaume Wantz et al, Polym Int, 63 (2014) 1346-1361.

For example, P3HT and PCBSD may be mixed in a ratio by mass of 1:1 and deposited with a thickness of 200 nm. The layer is then baked at 160° C. for 30 minutes in order to make it insoluble in usual solvents.

Generally, this active layer 3 will have a transmittance higher than 5% at the wavelength of the resist that will be used subsequently in the process.

Preferably, this transmittance is at least 20%, or even at least 50%, at this wavelength.

As indicated above, the active layer 3 includes discontinuous zones, or even defects, referenced 30 in FIG. 1.

These defects may consist of micron-sized holes or of zones having high free volumes. It may be a question of porosity or even of volumes that are not occupied by the polymer chains. They have dimensions comprised between 1 nm and a plurality of 100ths of a micron.

FIG. 2 illustrates another step (c) of the process, in which step the conductive layer 2 is removed locally through the defects 30.

As will be explained below, this step (c) will possibly, in practice, be omitted.

This local removal will be obtained using an etching technique, preferably a wet etching technique, i.e. via contact with an etchant solution. In one particular case of the invention, the etching will possibly be carried out by exposing the sample to vapors of the etchant solution. In certain cases, this removal is obtained with a solvent. However, it is the term etchant solution that will generally be used in the rest of the description.

Of course, the etchant solution must be chosen so as not to degrade the mechanical, optical and electrical properties of the active layer. The electrical properties of the active layer may be degraded because of an increase or a decrease in its conductivity, or even of the generation of intrinsic or extrinsic electrical traps in the active layer. The degradation of the optical properties of the active layer may for example result in a decrease in the light-absorption properties at the desired wavelength. Lastly, the degradation of the mechanical properties may in particular result in debonding or cracking of the active layer or in the active layer losing its flexibility.

Thus, generally, the etchant solution used will be selective, i.e. it will be able to etch the conductive layer 2 without however etching or attacking the active layer 3.

Generally, the etchant solution will be an acid or a base. It will possibly be pure or even diluted in water or in a solvent that is orthogonal to the active layer, i.e. a solvent that is not liable to attack or dissolve the active layer. Examples of orthogonal solvents may include methanol, ethanol, ethylene glycol, di-ethylene glycol, or even isopropanol.

Preferably, the etchant solution will be diluted in water and, preferably, in deionized water in order to prevent any contamination with ions, in particular metal ions (Na+, etc.).

A person skilled in the art will be able to choose the nature and concentration of the strong acid ($HNO_3$, HCl, $H_2SO_4$, KI, oxalic acid or even $H_3PO_4$) or weak acid (oxalic acid, $CH_3CO_2H$ or $NH_4+$) or even of the strong base (NaOH or KOH) or weak base ($NH_3$ or $CH_3CO_2-$) depending on the nature of the conductive electrode and on the etch rate. In this regard, the reader is in particular referred to the work "Thin Film Processes" edited by John L. Vossen and Werner Kern, Academic Press, New York, 1978.

Generally, the etch rate is comprised between 1 and 1000 Å/s.

The etchant solution is applied to the active layer 3 and it penetrates through the discontinuous zones 30 in this active layer. The etchant solution may be applied to all the surface of the active layer or locally. Localized deposition may be used in the case where a plurality of different devices are located in the same matrix-array, certain thereof being sensitive to the etchant solution.

The etchant solution then reaches the conductive layer 2 through the zones 30, this allowing the layer 2 to be removed locally, from the zones identified 20 in FIG. 2.

Depending on the composition of the electrode 2, the latter will possibly be etched in one step or in a plurality of steps and with one or more different etchant solutions.

The etching generally proceeds concentrically from the defect in the active layer.

Generally, the duration of the etching will be chosen such that the area of the etched zone or aperture 20 in the layer 2, etched through a defect 30 in the active layer 3, is at least equal to the area of this defect. These areas are here measured in the plane of the layers 2 and 3.

This is illustrated in FIG. 29 which shows, seen from above, the layer 3, level with a defect 30. It is a question here of a micron-sized hole the entrance of which is represented schematically by a disk. The latter has a diameter $d_1$.

Moreover, FIG. 29 shows, delineated by a dashed line, the zone 20 of the layer 2 that has been etched and that is therefore devoid of conductor. This zone 20 is schematically represented in the form of a disk of diameter $d_2$ that is larger than $d_1$.

Thus, in the case of a hole, $d_2$ is at least equal to $d_1$ and it will preferably be equal to at least 2 $d_1$, or even 5 $d_1$.

Of course, the discontinuous zone 30 may be a different shape from that of a disk. It may in particular be a question of an elongate crack.

In any case, the zone 20 is at least the size of the defect and preferably has a size at least 2 times or even 5 times larger.

It should also be noted that, when the layer 2 takes the form of a stack of a plurality of layers of different materials, different etchant solutions will possibly also be used in succession, so as to make it possible to completely etch all of the layer 2.

Once the etching has stopped, the stack illustrated in FIG. 2 will be rinsed, so as to stop the etching reaction and to remove any residual traces of etchant solution from the active layer 3.

This rinsing step will be carried out by dipping into at least one bath of deionized water, of an orthogonal solvent or even of an orthogonal-solvent/water mixture. As one variant, the rinsing solution will possibly be slightly acid (if the prior chemical attack is basic) and vice versa in order to buffer the pH of the solution during the rinsing.

Of course, the stack may also be rinsed by spraying a suitable liquid, as a variant to dipping in a bath.

By way of example, an electrode 2 made of conductive oxides such as aluminum-doped ZnO (AZO) or of multilayer type (AZO/Ag/AZO, etc.) will possibly advantageously be used because of the ease with which it may be etched (a thickness of 125 nm may be etched in less than 30 seconds in an etchant solution at 50° C.) in diluted aqueous solutions of HCl or $HCl/FeCl_3$ (in particular sold under the name TE100 by the manufacturer Transène).

The various embodiments of the process according to the invention will now be described in detail.

Reference is firstly made to FIGS. 3 to 6, which relate to the additional steps of the first embodiment of the process according to the invention.

Thus, FIG. 3 illustrates another step (d) of this first embodiment of the process according to the invention, in which a layer 4 of a negative resist is deposited on the active layer 3.

By convention and definition, a negative resist is a resist that remains in place in the exposed zones, and a positive resist is a resist that is removed from the exposed zones.

The thickness of this layer 4 is comprised between 10 nm and 100 μm and, preferably, between 0.2 μm and 5 μm.

Generally, the thickness of this layer 4 must be sufficient to cover the topology of the defects in the active layer.

This resist may be a fluorinated resist, for example the resist sold under the name OSCoR 4000 by the manufacturer Orthogonal. This resist may be one of the non-fluorinated resists in the SU-8 range.

The resist may be deposited on the active layer 3 by evaporation or, preferably, by wet processing. Preferably, this resist will be deposited by slot-die coating, spin coating or spray coating.

FIG. 4 illustrates another step (e) in which the resist is exposed through the back side 10 of the substrate. Consequently, it will be exposed in the zones corresponding to those in which the electrode 2 is not present and in particular in the zones 20 in which the electrode 2 was etched, as explained with reference to FIG. 2.

The ranges of exposure doses are those recommended in the datasheets of the resists and are typically about 50-100 mJ. Preferably, the dose used to cross-link the resist will be adjusted depending on the transmittance of the subjacent layers (substrate 1, electrode 2, active layer 3) at the exposure wavelength of the resist.

Preferably, the exposure will take place in an inert atmosphere, with a limited oxygen content, in order to limit photooxidation of the active layer.

FIG. 5 illustrates a following step (f) of the process, in which step the zones of the resist layer 4 that were not exposed are developed. This development is achieved by virtue of a developer that must be orthogonal to the subjacent layers and, in particular, to the active layer 3. In other words, the components of this developer do not dissolve the subjacent layers or dissolves them very little.

By way of example, for a resist of the SU-8 type, the developer will possibly be a product sold by MicroChem under the name SU-8 Developer, which is based on PGMEA. For a resist sold under the name OSCoR 4000, the developer will possibly be a product sold under the name Orthogonal Developer 103 Solution by Orthogonal.

FIG. 5 shows that, after this development step (f), negative-resist pads 40 are obtained that are located above the etched zones 20 of the layer 2 and, therefore, above the defects 30 present in the active layer 3. These negative-resist pads 40 allow the discontinuous zones or defects 30 to be passivated electrically, i.e. these zones 30 that are liable to create electrical leakage currents in the stack to be electrically isolated.

FIG. 6 illustrates step (g) in which a layer 5 of a conductor that will form the conductive second electrode is deposited.

This second electrode 5 will be able to play the role of anode or of cathode.

The thickness of this layer 5 is comprised between 5 nm and 500 μm and preferably between 8 nm and 30 μm.

In certain applications that require the top bit of the stack to provide absorption, this layer 5 will be semi-transparent. It may also be opaque.

Thus, when the stack is intended to form a photodiode, the latter may absorb photons by way of this electrode.

Here, the expression "semi-transparent electrode" is understood to mean an electrode that has a transmittance higher than 10% at the desired wavelength of absorption of the photodiode. This transmittance is, preferably, higher than 40%, or even 70%, at this wavelength.

This electrode 5 may be formed from an organic or inorganic material or even from a mixture of an organic material and an inorganic material.

Thus, this layer 5 will possibly take the form of a monolayer of one of these materials, of a mixture based on a plurality of these materials or even of a stack of layers of a single one or a mixture of these various materials, with specific interface layers.

It will possibly be deposited using the same techniques as those used to deposit the layer 2.

By way of example, the electrode 5 may be a monolayer or a multilayer comprising at least one of the following layers: metals (for example Ca, Ba, Au, Al, Ag, Pd, Pt, Ti or TiW), with a thickness smaller than 10 nm in the case where the electrode must be semi-transparent, metal oxides in monolayer form (for example ITO, GZO, AZO or ZnMgO) or tri-layer form (for example ITO/Ag/ITO, ZnO/Ag/ZnO or AZO/Ag/AZO), conductive polymers such as PANI, PEDOT/PSS or Plexcore OC1100, carbon-containing conductors such as graphene or carbon nanotubes.

The materials described above will possibly be employed in the form of continuous films or of percolating networks of nanowires (for example: nanowires of Ag, Cu, Au or ITO).

Interface layers will possibly optionally be deposited before the electrode 5 in order, for example, to pin its work function.

By way of example, if the final device is to have a diode behavior, it is preferably necessary for the electrodes 2 and 5 to have different work functions. To achieve this, use is made either of the work function of the conductive layer employed, or of an interface layer that will modulate the work function of the electrode in order to pin said work function to the value desired for the device.

Mention may be made, by way of example of interface layers, of: LiF, Ca and Ba, with thicknesses smaller than 5 nm; of PEI or PEIE; of metal oxides (TiOx, ZnO$_x$, MoO$_3$, CsCO$_3$, WO$_3$); of conjugated polyelectrolytes (PFN); or of Nafion.

In one variant of the first embodiment of the process according to the invention, which is illustrated in FIGS. 7 to 12, a passivating layer 6 is deposited on the active layer between steps (c) and (d) which were described above with reference to FIGS. 2 and 3.

FIGS. 7 and 8 show that this passivating or buffer layer 6 is deposited between the active layer 3 and the resist layer 4. This layer 6 serves to protect the active layer 3 from the resist. This layer 6 is of electrically insulating nature.

It may be deposited by wet processing or by evaporation.

It has a thickness comprised between 1 nm and 20 μm.

It may for example be Parylene®, an oxide layer deposited by ALD (the metal oxide Al$_2$O$_3$, the metal nitride SiN) or a fluoropolymer such as that sold under the name Cytop® by ASAHI.

FIGS. 9 and 10 illustrate steps (e) and (f) of exposing and developing the resist, which are identical to the steps described with reference to FIGS. 4 and 5.

This layer 6 is then etched by wet etching or by plasma etching, after steps (e) and (f) of exposing and developing the resist.

This etching step is illustrated in FIG. 11.

The layer 6 is thus present under the resist pads 40 that lie above the defect zones 30.

FIG. 12 illustrates step (g) of forming the conductive second electrode, which is identical to that described with reference to FIG. 6.

A first example of this first embodiment of the process according to the invention will now be described.

It allows organic photodiodes to be produced on a rigid substrate made of glass.

The first electrode 2 is made of aluminum and has a thickness of 100 nm.

It is deposited by cathode sputtering then localized with techniques that are standard in microelectronics. The electrode 2 is then descummed using an RIE plasma process.

A bulk-heterojunction active layer 3 of a thickness of 150 nm is deposited on all the surface of the electrode 2 by spin coating, or by other printing techniques such as slot-die coating, screen printing, rotogravure printing, inkjet printing or spray coating.

The active layer is a donor/acceptor blend, the donor possibly being the conjugated polymer regioregular poly(3-hexylthiophene) and the acceptor the fullerene-derivative molecule 60PCBM. The donor and the acceptor have a ratio of 1:1 in the blend.

The stack is then dipped in an aluminum etchant solution (for example Alu Etch 1960 from Fujifilm (25 vol H$_3$PO$_4$+1 vol HNO$_3$+5 vol CH$_3$COOH+H$_2$O) at a temperature of 60° C., the etch rate being v=7 nm/s).

The layer 3 is then rinsed abundantly in deionized water, then dried.

A resist 4 of the type sold under the name OSCoR 4000 by Orthogonal is deposited by spin coating on the active layer 3 in order to obtain a thickness of 1 μm. The obtained resist layer 4 is baked at 90° C. for 1 min. It is then exposed via the back side 10 of the substrate, with a wavelength of 365 nm and a dose of 100 mJ/cm$^2$. What is referred to as a post-bake step of 1 min at 90° C. is carried out. It makes it possible to finish adequately curing the resist in the exposed zones so that it is not removed in the developing step.

The unexposed zones of the resist layer 4 are then developed for 90 s and using the developer sold under the name "Developer 103" supplied by Orthogonal.

Lastly, the second electrode 5 (anode) is deposited. It includes an interface layer of 100 nm of PEDOT-PSS, on which a layer of evaporated Ag is deposited, the thickness of which is 8 nm.

In another example of the first embodiment of the process according to the invention, the substrate 1 is a flexible substrate made of PET.

In addition, the first electrode 2 (the cathode) is composed of two layers: an opaque conductive first layer made of Cr of a thickness of 100 nm and a second what is called interface layer made of ZnO of a thickness of 30 nm.

These two layers are deposited by cathode sputtering then localized with techniques that are standard in microelectronics.

The active layer has the same characteristics as in the preceding example, the acceptor possibly being the fullerene-derivative molecule PCBSD. In addition, the active layer is baked at 160° C. for 30 min in order to cross-link it and make it insoluble.

In a first step, the stack is dipped in a ZnO etchant solution (for example the solution sold under the reference TE100 by Transène) for 30 s.

In a second step, the stack is dipped in a Cr etchant solution (for example Chrome Etch ((5-10%) nitric acid/(20-25%) diammonium cerium hexanitrate, with an etch rate of V=10 nm/min).

This active layer is then rinsed abundantly in deionized water then dried.

2 μm of SU-8 resist is deposited by spin coating on the active layer. This layer is then baked at 100° C. for 1 min.

It is then exposed via the back side of the substrate, with a wavelength of 365 nm and a dose of 100 mJ/cm². The unexposed zones of the resist are then developed for 90 s and using a PGMEA-based developer.

Lastly, the electrode 5 (anode) is deposited. It includes an interface layer of 100 nm made of PEDOT-PSS, on which a semi-transparent Ag-nanowire layer in the form of a 2D percolating network is deposited.

An example of the variant of the first embodiment illustrated in FIGS. 7 to 12 will now be described. This variant allows organic photodiodes to be produced on a rigid substrate made of glass.

The first electrode (cathode) 2 is made up of a stack of three layers AZO/Ag/AZO, these three layers having a thickness of 600 nm, 10 nm and 600 nm, respectively.

This first electrode 2 is deposited by cathode sputtering then localized with techniques that are standard in microelectronics.

The active layer 3 has the same characteristics as those of the first example described above.

The stack is then dipped in an AZO etchant solution (for example the solution sold under the name TE100 by Transène), then in an Ag etchant solution (for example, a solution such as $4CH_3COH+1NH_4OH+1H_2O_2$, with an etch rate of v=6 nm/s) and, lastly, for 60 seconds in an AZO etchant solution.

The layer 3 is then rinsed abundantly in deionized water, then dried.

A passivating or buffer layer made of Cytop® is deposited on the active layer 3 by spin coating, in order to obtain a thickness of 300 nm.

The surface of the layer 3 is activated with a plasma in order to make it wetting.

1 μm of SU-8 resist is deposited on the layer.

The resist is then exposed via the back side of the substrate, with a wavelength of 365 nm and a dose of 100 mJ/cm².

The unexposed zones of the resist are lastly developed using a PGMEA-based developer for 40 s.

Using the resist pads as mask, the buffer layer 6 is etched by dipping it, for 30 s, in a fluorinated solvent (for example that sold under the name CT-SOLV 180).

The second electrode 5 is produced as described in the first example.

It should be noted that, in the context of this first embodiment of the process, step (c), in which the first electrode is removed locally by chemical attack through the discontinuous zones of the active layer, may be omitted.

In this case, the resist is exposed through the electrode 2 and in the zones corresponding to those of the defects 30 in the active layer 3.

Reference is now made to FIGS. 13 to 18, which relate to the additional steps of the second embodiment of the process according to the invention. The first electrode (layer 2) is therefore opaque.

Thus, FIG. 13 illustrates a step (g) of this second embodiment of the process according to invention, in which the second electrode 5 is formed directly on the active layer 3, after steps (a) to (c) illustrated in FIGS. 1 and 2.

This second electrode 5 may have the same characteristics as the electrode described with reference to FIG. 6, though it will be noted that it must at least be transparent at the wavelength of the resist. It may also be deposited using the same techniques.

The electrode 5 may be designed so as to cut off the wavelength of the resist but without cutting off the wavelength of absorption of the photodiode.

Figure 14:
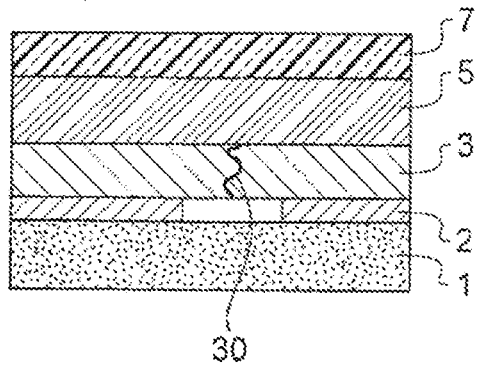

In practice, this means that, in this second embodiment of the process, step (g) is carried out between steps (c) and (d), this step (d) now being described with reference to FIG. 14.

This step (d) consists in depositing a layer 7 of a positive resist on the second electrode 5.

This layer 7 may be deposited by evaporation or, preferably, by wet processing, and in particular by slot-die coating, spin coating or spray coating.

The thickness of this layer 7 is comprised between 10 nm and 10 μm and, preferably, between 0.2 μm and 5 μm.

This resist may be one of the resists sold under the names Shipley S1818, Shipley S1814, Shipley S1828, Shipley Megaposit SPR220, series AZ9260 or AZTX1311-DUV by Microchemicals.

Figure 15:
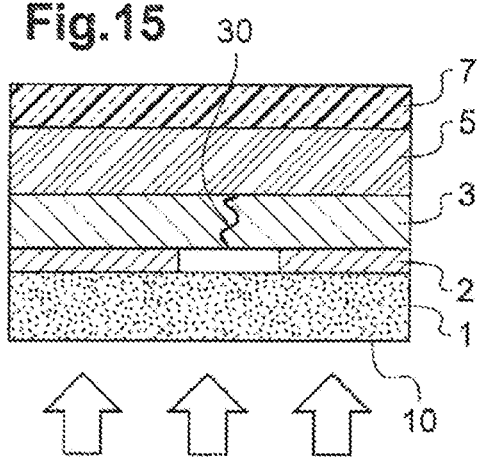

FIG. 15 illustrates another step (e) in which the resist is exposed through the back side 10 of the substrate. Therefore, it will be exposed in the zones in which the first electrode 2 is not present and in particular in the zones 20 in which the electrode 2 has been etched.

In so far as the electrode 2 is spatially localized, there are zones around the electrode 2 that may be transparent at the wavelength of the resist. Therefore, the resist will be exposed in these zones around the electrode 2.

The conditions of exposure of this resist layer are identical to those that were described for the resist layer 5 described with reference to FIGS. 3 to 6 and will not be described in detail.

Figure 16:
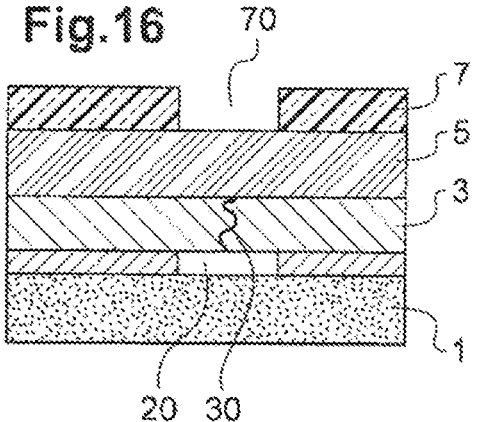

FIG. 16 illustrates step (f) of the process, in which step the resist layer 7 is developed.

This step is carried out using a developer that is orthogonal to the subjacent layers and in particular to the active layer 3 and to the second electrode 5.

By way of example, mention may be made of the developers sold under the names MF319 (Shipley), AZ® 726 MIF (Clariant) and MF-26A (Shipley).

Thus, FIG. 16 shows that, at the end of step (f), the resist layer 7 contains zones or holes 70 located above defects 30 in the active layer 3, in which the resist is absent. In practice, level with these defects 30 and on either side of the assembly consisting of the active layer 3 and the second electrode 5, no material is present, because of the existence of the zones 20 and 70.

Figure 17:
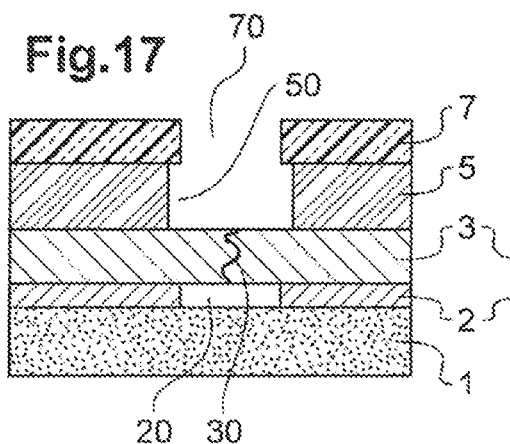

FIG. 17 illustrates a step (h) of etching the second electrode 5.

This etching occurs in the holes 70 formed in the resist layer 7.

This etching step is carried out using chemical and/or physical processing.

Chemical processing consists in using etchant solutions or solvents. Physical processing for example consists in using RIE plasmas.

The etching will possibly stop either on the upper surface of the active layer 3, or in the thickness of the active layer 3, or level with the first electrode 2 after the active layer has been completely etched away.

FIG. 17 illustrates the situation in which the etching is stopped on the upper surface of the active layer 3. It leads to apertures 50 being formed in the second electrode 5.

FIG. 17 shows that the second electrode 5 is located mainly in the zones facing those in which the first electrode 3 is present.

In other words, by virtue of the deposition of the resist layer 7, it is possible to etch the second electrode 5 in the regions surrounding the defect zones 30. Thus, these zones 30 are electrically isolated both from the first electrode 2 by virtue of the formation of the apertures 20 and from the second electrode 5 by virtue of the apertures 50.

Figure 18:
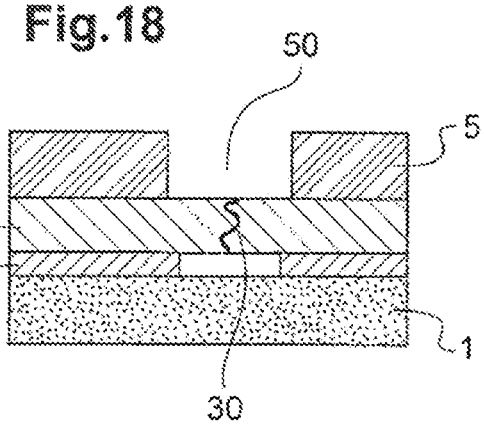

FIG. 18 illustrates an additional step (i) of this process, consisting in removing the resist after the etching step (h).

This step is carried out by virtue of a solvent that is orthogonal to the subjacent layers, acetone for example.

This step is optional.

It should be noted that, in the context of this second embodiment of the process, step (c) described with reference to FIG. 2 may also be omitted, the resist being exposed through the electrode 2, and in the zones corresponding to the defects 30 in the active layer 3.

In one variant embodiment of the process illustrated in FIGS. 13 to 18, a passivating layer is deposited on the second electrode 5, i.e. between steps (g) and (d).

The function of this passivating layer is to protect the first electrode 2, the active layer 3 and the electrode 5 from the resist.

It may be conductive or insulating.

It must have the property of letting the exposure wavelength of the resist pass.

Thus, this passivating layer may be a thin layer (<15 nm thick) of a metal, for example Ag, Au, Al or Ti, or of a dielectric deposited by evaporation (for example Parylene® or metals), by PECVD, CVD, ALD, or deposited in solution (for example polystyrene, polyvinylphenol, Cytop, cycloolefin or PMMA).

This passivating layer will be etched by chemical processing or by physical processing between step (f) of developing the resist, which is illustrated in FIG. 16, and the etching step (h) illustrated in FIG. 17.

This second embodiment of the process has the following advantages with respect to the first embodiment described with reference to FIGS. 1 to 12.

Firstly, it allows positive resists to be used, the choice of positive resists being larger than the choice of negative resists.

In addition, it is easier to deposit the resist layer on the second electrode 5 than on the active layer. Specifically, resists contain organic solvents that may dissolve the material from which the active layer is made. In contrast, the various types of electrode 5 (metal, metal oxide, conductive polymers, etc.) are not or not very sensitive to organic solvents.

Lastly, the second electrode 5 allows the active layer to be protected from the solvents used to dissolve the resist in steps (f) and (i).

An example of this second embodiment of the process according to the invention will now be described.

It leads to the production of organic photodiodes on a rigid substrate made of glass.

The first electrode 2 is made of gold and has a thickness of 100 nm.

This first electrode 2 is deposited by cathode sputtering then localized with techniques that are standard in microelectronics.

The electrode 2 is then covered with a PEIE layer having a thickness of 20 nm, which is deposited by spin coating. This layer is rinsed abundantly in deionized water in order to leave only a PEIE monolayer absorbed on the surface of the electrode 2.

Next, a bulk-heterojunction active layer 3 of about 150 nm thickness is deposited on all the surface of the electrode 2 by spin coating, or using other printing techniques such as slot-die coating, screen printing, rotogravure printing, inkjet printing or spray coating.

The active layer is a donor/acceptor blend, the donor possibly being the conjugated polymer PCPDTBT and the acceptor the fullerene-derivative molecule 60PCBM. The donor and the acceptor have a ratio of 1:1.5 in the blend.

The stack is then dipped in a gold etchant solution for 10 min.

The etchant solution is a commercially available mixture based on KI/I2 (for example VOLUSOL, which allows 100 nm of Au to be etched in 100 s).

The active layer 3 is then rinsed abundantly in deionized water then dried.

The second electrode 5 (anode) is then deposited. It is composed of an interface layer of 100 nm made of PEDOT-PSS, on which a layer of evaporated Ag the thickness of which is 8 nm is deposited.

A layer of the resist sold under the name S1818 by Shipley is deposited on the second electrode 5 by spin coating.

This layer has a thickness of 1 μm.

The resist is then exposed via the back side 10 of the substrate, with a wavelength of 365 nm and a dose of 100 mJ/cm$^2$. The resist is then developed using the developer sold under the name MF319 for 40 s.

The electrode 5 is then completely etched away using an RIE (reactive ion etching) oxygen plasma.

Lastly, the resist is removed by dipping for 30 seconds in an acetone bath.

It was indicated above, with reference to FIG. 17, that the second electrode 5 is mainly located in zones facing those in which the first electrode 2 is present.

The consequences will be different for unitary devices, such as unitary diodes, or for pixel matrix-arrays.

For unitary diodes, which are of macroscopic size (diameter ~1 mm), the consequence is that electrical contact to the electrode 5 will have to be made in the active area of the diode, which corresponds to the zone of overlap between the electrode 5 and the electrode 2.

In the case where it is desired to redistribute the electrical contact to the electrode 5, it will be necessary to add a conductive third layer, or third electrode, that will connect the electrode 5 to an electrical contact redistribution pad.

The third electrode connects to electrode 5 in a small area of the diode in order to prevent the electrode 5 from short-circuiting the initially passivated defects.

For a pixel matrix-array, at the end of the etching step (h), the second electrode 5 no longer forms a continuous layer. Therefore, the pixels are disconnected from one another.

Figure 30:
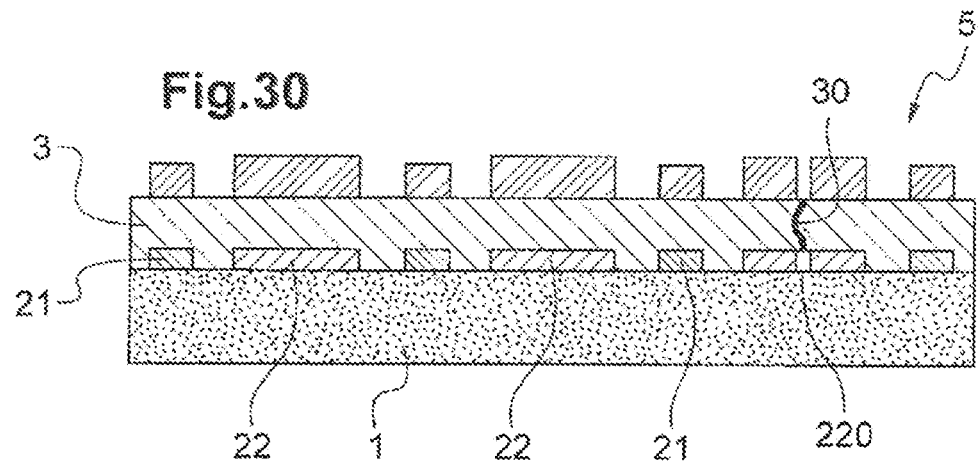
FIG. 30 is a cross-sectional view illustrating a pixel matrix-array obtained with the second embodiment of the process according to the invention.

FIG. 30 is a cross-sectional view that shows such a pixel matrix-array.

Thus, FIG. 30 illustrates, arranged in a row, a row of pads 22 of the first electrode 2, row pads 21 being placed between them.

The first-electrode pads 22 and the row (or column) pads 21 are opaque zones.

Thus, after steps (d) to (h) have been implemented, the matrix-array illustrated in FIG. 30 is obtained.

This figure shows a defect 30 in the active layer 3 and a zone 220 of a pad 22 facing the defect 30, in which zone the pad has been etched.

In the case of matrix-arrays, it is therefore necessary to make provision for an additional step after step (i) in order to make it so that the electrode 5 is once again continuous.

A first solution consists in depositing at least one conductive layer (of the same nature as that of the electrode 5 or not), in order to reconnect all the electrode pads 5 together and to obtain a continuous conductive layer.

Figure 31:
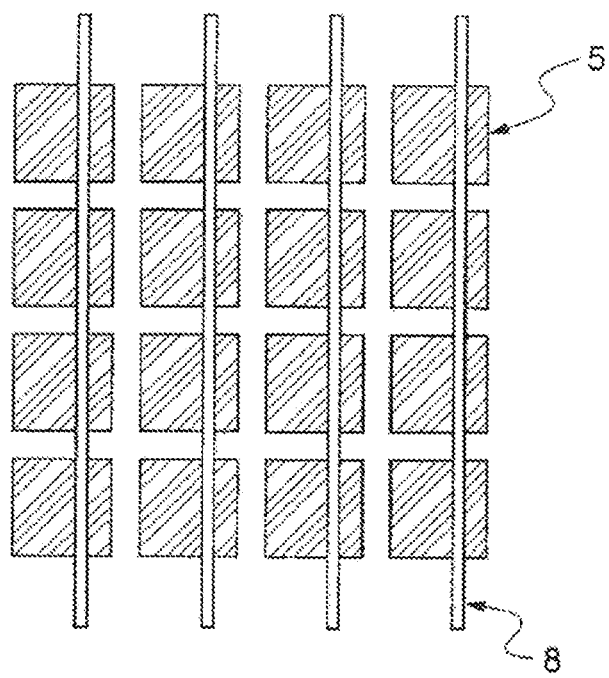
FIG. 31 is a view from above of a pixel matrix-array obtained with the second embodiment of the process according to the invention.

FIG. 31 illustrates this conductive layer 8 and shows that this layer is localized, in so far as it consists of conductive lines electrically connecting the pads of the second electrode 5.

In practice, it is necessary for this conductive layer 8 to be localized in order to prevent it from short-circuiting the first electrode 2 through the defects present in the active layer 3.

Another variant consists in making the spaces located between the pads of the first electrode 2 opaque at the wavelength of exposure of the resist.

Figure 32:
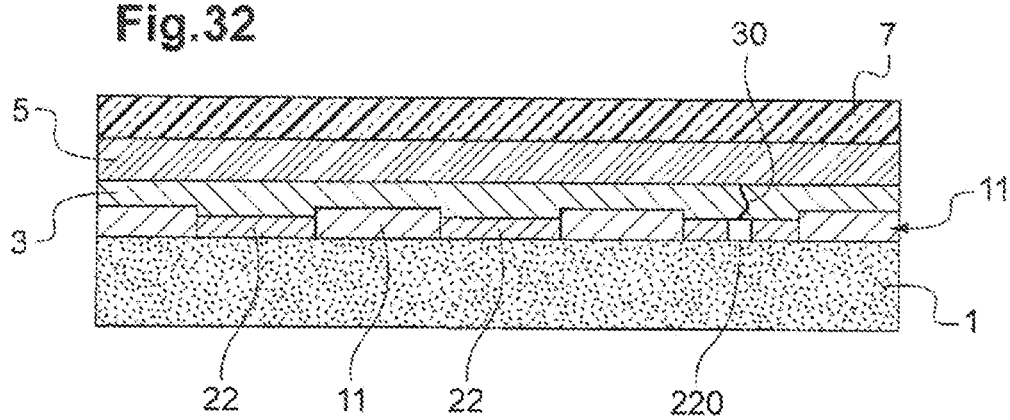
FIGS. 32 to 34 are cross-sectional views showing one variant of the second embodiment of the process according to the invention, for obtaining a pixel matrix-array.

Thus, as illustrated in FIG. 32, a layer 11 of a material that is opaque at this wavelength may be deposited between the pads 22 of the first electrode 2, steps (g) and (d) being carried out as was described with reference to FIGS. 13 and 14.

For a wavelength of around 365 nm, this localized layer 10 may be made of polyimide, for example the polyimide sold under the name NISSAN SE5291, or a negative resist such as SK-3000L (Fujifilm), this layer 10 having a thickness of 0.1 μm to 5 μm.

This opaque layer 11 acts as a mask. Thus, in step (e), the resist layer may be exposed only in the zone located above the pads of the first electrode 2 and in so far as defects are present.

Figure 33:
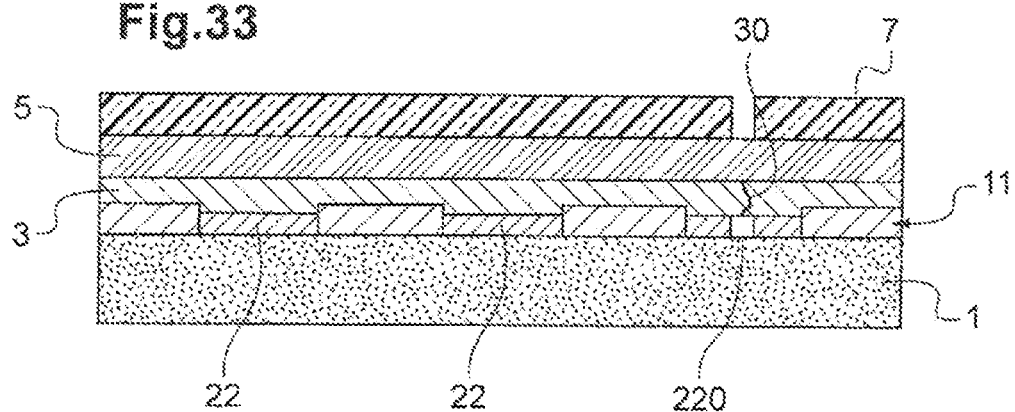

FIG. 33 illustrates the matrix-array after step (e) of exposing the resist through the substrate 1 and step (f) of developing the resist. These steps (e) and (f) are carried out as described with reference to FIGS. 15 and 16.

Figure 34:
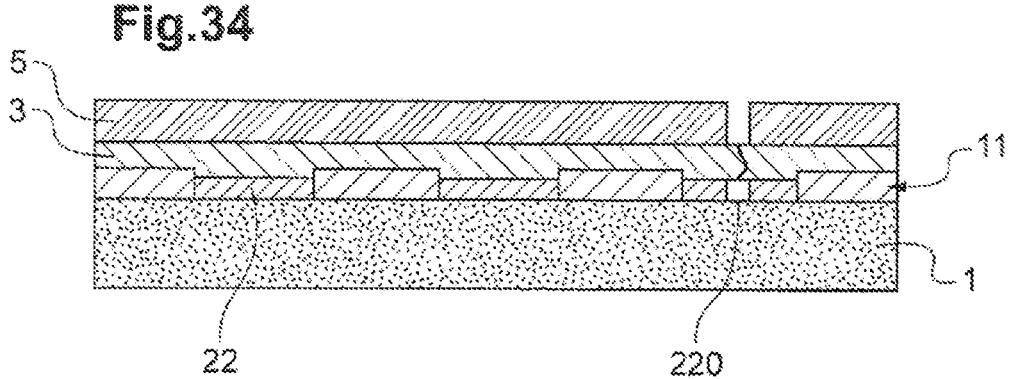

FIG. 34 illustrates this matrix-array after steps (h) of etching the second electrode 5 and (i) of removing the resist, such as described with reference to FIGS. 17 and 18.

FIG. 34 shows that, even after this step of etching the second electrode 5, the latter remains in the form of a continuous layer. It is therefore not necessary to deposit a localized third electrode, such as that illustrated in FIG. 31.

This variant is advantageously used for matrix-arrays having a small pitch between the pixels.

Reference is now made to FIGS. 19 to 24, which illustrate the additional steps corresponding to the third embodiment of the process according to the invention.

FIG. 19 illustrates another step (d) of this third embodiment of the process according to the invention, in which a layer 7 of a positive resist is deposited on the active layer 3, after steps (a) to (c) illustrated in FIGS. 1 and 2.

This resist layer may have the same characteristics as that described with reference to FIG. 14.

It may also be deposited using the same techniques.

The resist layer 7 will therefore not be described in more detail.

FIGS. 20 and 21 illustrate steps (e) of exposing and (f) of developing the resist layer.

These steps (e) and (f) may be carried out in the way that was described with reference to FIGS. 15 and 16.

These two steps will therefore not be described in more detail.

FIG. 21 shows that, at the end of step (f), holes 70 have been formed in the layer 7, these holes being located facing zones 20 in which the electrode 2 was etched in step (c).

FIG. 22 illustrates an additional step (j) of this process consisting in depositing an electrically insulating passivating layer 9 on the resist layer 7 and on the active layer 3 level with the holes 70 produced in the resist layer 7.

This passivating layer may be an insulating polymer of the fluoropolymer or cyclic-polyolefin type, or a layer deposited by ALD (for example a metal oxide such as $Al_2O_3$ or a metal nitride such as SiN), or a layer deposited by evaporation (for example of Parylene®).

In so far as this layer 9 conforms to the surface of the stack, it allows the defects 30 in the active layer 3 to be covered.

FIG. 23 illustrates a complementary step (k) of this process consisting in removing the passivating layer 9 locally by removing the resist 7. This removal is achieved by dissolving the resist by dipping it into one of its solvents (acetone for example), this method being known as "lift off". The solvent will infiltrate under the layer 9, dissolve the resist and lift off the layer 9 in the dissolved zones.

In order to favor this removing step, the passivating layer will possibly be discontinuous and open in zones of the sample beyond the electrode 2. These openings will possibly be produced additively, by direct localization during the deposition of the passivating layer, or subtractively, by laser ablation for example.

FIG. 23 shows that after this step (k), pads 90 made of electrical insulator are obtained, these pads being located above the etched zones 20 of the layer 2 and the defects present in the active layer 3. These pads 90 allow the zones 30 liable to create electrical leakage currents in the stack to be electrically isolated.

FIG. 24 illustrates the last step (g) of this process, in which step the second electrode 5 is deposited on the active layer 3.

This second electrode 5 may have the same characteristics as those described with reference to FIG. 6. It may also be deposited using the same techniques.

This second electrode 5 will therefore not be described in more detail.

It should be noted that, in the context of this third embodiment of the process, step (c) described with reference to FIG. 2 may also be omitted, the resist being exposed through the electrode 2 and in the zones corresponding to the defects 30 in the active layer 3.

As a variant, another passivating layer may be deposited between steps (c) and (d). This passivating layer is therefore deposited on the active layer 3 and serves to protect the first electrode 2 and the active layer 3 from the resist.

This passivating layer must be electrically insulating and have the property of letting the wavelength of exposure of the resist pass.

It may be made of a dielectric deposited by evaporation (for example Parylene®), by PECVD, CVD, ALD, or deposited in solution (polystyrene, polyvinylphenol or Cytop® or cycloolefin, etc.).

This passivating layer is then etched by chemical processing or by physical processing between steps (k) and (g) illustrated in FIGS. 23 and 24.

An example of this third embodiment of the process according to the invention will now be described. It allows organic photodiodes to be produced on a rigid substrate made of glass.

The first electrode 2 (the anode) is made of chromium and has a thickness of 10 nm.

It is deposited by cathode sputtering then localized with techniques that are standard in microelectronics. The electrode 2 is descummed using an RIE plasma process.

A bulk-heterojunction active layer 3 of 150 nm thickness is deposited on all the surface of the first electrode 2 by spin coating or other printing techniques such as slot-die coating, screen printing, rotogravure printing, inkjet printing or spray coating.

The active layer is a donor/acceptor blend, the donor possibly being the conjugated polymer PBDTTT-C and the acceptor the C60 fullerene molecule. The donor and the acceptor have a ratio of 1:2 in the blend.

The stack is then dipped in a Cr etchant solution for 10 min. The etchant solution is for example a mixture of the type: 1 g of $Ce(SO_4)_2$-$2(NH_4)2$-$SO_{4-2}H_2O$+5 ml $HNO_3$+25 ml $H_2O$, the etching is carried out at 28° C. and the etch rate is 8.5 nm/min.

The layer 3 is then rinsed abundantly in deionized water then dried. A layer of resist of the type sold under the name S1814 by Shipley is deposited on the active layer. It is then exposed via the back side of the substrate with a wavelength of 365 nm and a dose of 80 mJ/cm$^2$.

The resist layer is developed using the developer sold under the name MF319 (Shipley) for 40 s.

An $Al_2O_3$ passivating layer having a thickness of 50 nm is deposited by ALD. Areas of diameter smaller than 50 µm are opened in places in the passivating layer, in zones beyond the electrode 2, using an ablation employing an excimer laser. These open zones will allow the solvent to dissolve the resist and to infiltrate through the buffer layer and the lift off to be achieved.

The resist is then stripped in an acetone bath for 1 min.

The electrode 5 (the cathode), which is composed of PEDOT/PSS and has a thickness of 50 nm, is lastly deposited by spin coating.

FIGS. 25 to 28 illustrate a variant of this third embodiment of the process according to the invention.

This variant comes after steps (a) to (c) described with reference to FIGS. 1 and 2 and steps (d) and (f) described with reference to FIGS. 19 to 21.

This variant includes a step (l) of etching the active layer 3.

This step (l) is illustrated in FIG. 25.

This etching is carried out in the holes 70 formed in the resist layer 7.

It is carried out by wet processing, for example by dissolution in solvents, or by physical processing, using RIE plasmas in particular.

Thus, as FIG. 25 shows, the stack is completely removed, level with the zones 20 of the first electrode 2 that have been etched.

FIG. 26 illustrates the following step (j) in which a passivating layer 9 is deposited on the stack.

This layer 9 may have the same characteristics as the passivating layer described with reference to FIG. 22. It may also be deposited using the same techniques. It will therefore not be described in more detail.

FIG. 26 shows that this layer 9 conforms to the surface of the stack and that it will therefore make contact with the substrate 1 in the zones 20 of the first electrode 2 that have been etched beforehand.

FIG. 27 illustrates step (k) of removing the resist present in the layer 7.

This removal of the resist may be achieved in the way that was described above with reference to FIG. 23 and it will not be described in more detail.

FIG. 27 shows that, by virtue of the deposition of the resist layer 7, it was possible to etch the active layer 3 level with the defects 30, which have therefore been eliminated. Moreover, the passivating layer 9 allows the first electrode 2 and the second electrode 5 to be isolated.

FIG. 28 illustrates step (g) in which the conductive second electrode 5 is deposited on the stack.

This step (g) may be carried out in the way that was described above with reference to FIG. 6 and it will therefore not be described in more detail.

It is also possible to combine the two variants of this third embodiment of the process according to the invention, by providing another passivating layer on the active layer 3, this passivating layer being etched before step (l) of etching the active layer, such as illustrated in FIG. 25.

It should be noted that, in the context of this third embodiment of the process according to the invention, if the first electrode 1 is designed so as to cut off the wavelength of the resist, without cutting off the wavelength of absorption of the photodiode, the transmittance of the second electrode 5 is of no importance.

An example embodiment of the variant described with reference to FIGS. 25 to 28 will now be described.

It allows organic photodiodes to be produced on a rigid substrate made of glass.

The first electrode 2 (the anode) is made of gold and has a thickness of 100 nm.

It is deposited by cathode sputtering then localized with techniques that are standard in microelectronics.

A bulk-heterojunction active layer 3 of a thickness of 10 nm is deposited on all the surface of the electrode 2 by spin coating or other printing techniques such as slot-die coating, screen printing, rotogravure printing, inkjet printing or spray coating.

The active layer is a donor/acceptor blend, the donor possibly being the conjugated polymer TFB and the acceptor the fullerene-derivative molecule PCBSD. The donor and the acceptor have a ratio of 1:2 in the blend.

The active layer is baked at 160° C. for 30 minutes in order to cross-link it and make it insoluble.

The stack is then dipped in the Au etchant solution for 10 min.

The etchant solution is a commercially available mixture based on KI/I2 (for example VOLUSOL; 100 nm of Au being etched in 100 s).

The layer 3 is then rinsed abundantly in deionized water then dried.

A layer of the resist sold under the name S1818 by Shipley is deposited on the active layer, then exposed via the back side of the substrate, with a wavelength of 365 nm and a dose of 80 mJ/cm$^2$.

The resist layer is developed using the developer sold under the name MF319 for 40 s.

The active layer is then etched using an RIE argon plasma.

An $Al_2O_3$ passivating layer having a thickness of 50 nm is then deposited by ALD. Areas of diameter smaller than 50 µm are opened in places in the passivating layer, in zones beyond the electrode 1, using an ablation employing an excimer laser. These open zones will allow the solvent to dissolve the resist and to infiltrate through the buffer layer and the lift off to be achieved.

The resist is then stripped in an acetone bath for 1 min.

The electrode 5 (the cathode), which is composed of an Al layer with a thickness of 3 nm and an Ag layer with a thickness of 7 nm, is lastly deposited by vacuum evaporation.

It should be noted that in all the embodiments of the process according to the invention, the resist layer may be deposited on all the surface of the stack or only in localized zones. This localized deposition will possibly be achieved using a mask.

On reading the description of the various embodiments of the process according to the invention, it will be understood that this process allows the problem of parasitic electrical leakage currents through an organic semiconductor layer of a stack to be solved by electrically passivating the fragile zones in this organic layer, whether these be holes or zones of different morphologies.

To do so, the process may provide, as in document FR-2 991 505, for an electrode zone under the active layer to be locally etched through the defects in this layer. This step (c) of local etching makes the process even more effective at passivating the defects in the active layer.

In addition, this process provides for a positive or negative resist to be deposited, which resist is exposed through the electrode present under the active layer.

Thus, the process allows a positive resist to be opened or a negative resist to be deposited, precisely above fragile zones, which are the origin of the electrical leakage currents. The places in which the resist is opened or deposited thus self-align with the defects present in the active layer.

The resist allows, by virtue of specific steps, defects liable to create electrical leakage currents in the stack to be electrically isolated, by patching them locally.

Generally, the first embodiment of the invention is a preferred embodiment. Specifically, this process has the fewest steps and is the easiest to implement. In particular, it does not include a step of etching the second electrode 5 or the active layer 3 which are, in addition, steps that are tricky to carry out. Lastly, this process is the most suitable for obtaining pixel matrix-arrays.

The process according to the invention will advantageously possibly be used to increase performance and decrease faults in organic electronic devices used in discrete components or in more complex systems such as passive or active matrix-arrays. These devices will possibly be organic or hybrid organic/inorganic.

It will possibly in particular be a question of current-rectifying diodes, solar cells, photodiodes, capacitors, memories, lasers, light-emitting diodes or field-effect transistors.

The reference signs inserted after the technical features disclosed in the claims are only intended to allow the latter to be more easily understood and in no way limit the scope thereof.

The invention claimed is:

1. A process for producing a stack of a first electrode/active layer/second electrode, wherein the stack is intended for an electronic device, in particular an organic photodetector or an organic solar cell, said process comprising following steps:
   (a) depositing a first conductor layer on a front side of a substrate, in order to form the first electrode; and
   (b) depositing an active layer taking a form of a thin organic semiconductor layer, the thin organic semiconductor layer comprising discontinuous zones; wherein the depositing active layer (b) further includes following steps, (d), (e), (f) and (g) wherein:
   (d) depositing a resist layer of positive resist on a side of the stack which is opposite to the substrate, wherein the substrate is at least partially transparent;
   (e) exposing the resist layer via a back side of said substrate;
   (f) developing the resist layer; and
   (g) depositing a second conductor layer in order to form the conductive second electrode wherein the discontinuous zones are defects that pass through the active layer.

2. The process as claimed in claim 1, step (f) leading to formation of holes in the resist layer level with the discontinuous zones, and step (g) being carried out between steps (b) and (d), a step (h) of etching the conductive second electrode being carried out after step (f).

3. The process as claimed in claim 2, comprising an additional step (i) of removing the resist after the etching step (h).

4. The process as claimed in claim 2, comprising an additional step of depositing a passivating layer on the conductive second electrode, before step (d) of depositing the resist layer.

5. The process as claimed in claim 1, step (f) leading to formation of holes in the resist layer level with the discontinuous zones, the process including two additional steps between steps (f) and (g), a step (j) of depositing a passivating layer on the resist layer and a step (k) of removing the resist.

6. The process as claimed in claim 5, wherein before step (j), a step (l) of etching the active layer through the holes formed in the resist is provided.

7. The process as claimed in claim 5, wherein a buffer layer is deposited on the active layer between steps (b) and (d), a step of etching the buffer layer then being provided between steps (k) and (g).

8. The process as claimed in claim 1, wherein a step (c) of removing the conductive first layer locally via chemical attack, through the discontinuous zones of the active layer, is carried out after step (b).

* * * * *